US010749524B2

(12) United States Patent
Takamori et al.

(10) Patent No.: US 10,749,524 B2
(45) Date of Patent: Aug. 18, 2020

(54) ISOLATOR CIRCUIT

(71) Applicant: Mitsubishi Electric Corporation, Chiyoda-ku, Tokyo (JP)

(72) Inventors: Takahiro Takamori, Tokyo (JP); Kanji Kitamura, Tokyo (JP); Tetsuya Masaoka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/475,827

(22) PCT Filed: Jan. 18, 2017

(86) PCT No.: PCT/JP2017/001579
§ 371 (c)(1),
(2) Date: Jul. 3, 2019

(87) PCT Pub. No.: WO2018/134920
PCT Pub. Date: Jul. 26, 2018

(65) Prior Publication Data
US 2019/0334521 A1    Oct. 31, 2019

(51) Int. Cl.
*H03K 17/691* (2006.01)
*H02M 1/08* (2006.01)
(Continued)

(52) U.S. Cl.
CPC .......... *H03K 17/691* (2013.01); *H02M 1/08* (2013.01); *H02M 3/33515* (2013.01);
(Continued)

(58) Field of Classification Search
CPC .................... H03K 17/689; H03K 17/691
See application file for complete search history.

(56) References Cited

U.S. PATENT DOCUMENTS 7,075,329 B2 *  7/2006  Chen ................. H01F 17/0006
                                                257/531
7,796,076 B2 *  9/2010  Melanson ............ H03K 17/691
                                                341/155
(Continued)

FOREIGN PATENT DOCUMENTS

JP      2010010762 A    1/2010
KR   10-2011-0014898 A  2/2011

OTHER PUBLICATIONS

International Search Report (PCT/ISA/210) dated Apr. 18, 2017, by the Japan Patent Office as the International Searching Authority for International Application No. PCT/JP2017/001579.
(Continued)

*Primary Examiner* — Hai L Nguyen
(74) *Attorney, Agent, or Firm* — Buchanan Ingersoll & Rooney PC

(57) ABSTRACT

An isolator circuit according to the present invention includes a first isolator, an AD converter, and a second isolator. The first isolator is configured to galvanically isolate a first terminal and a second terminal from each other. The first isolator receives an input pulse signal and outputs an output pulse signal to the second terminal. The AD converter is configured to output a digital signal corresponding to a duty ratio of the output pulse signal. The second isolator is configured to galvanically isolate the second terminal and the third terminal from each other. The second isolator is configured to receive the digital signal and outputs a feedback pulse signal to the third terminal.

11 Claims, 14 Drawing Sheets

(51) Int. Cl.
  *H02M 3/335* (2006.01)
  *H03M 1/12* (2006.01)
  *H02M 1/00* (2006.01)

(52) U.S. Cl.
  CPC ......... *H02M 3/33523* (2013.01); *H03M 1/12* (2013.01); *H02M 2001/0012* (2013.01)

(56) References Cited

U.S. PATENT DOCUMENTS

| | | | |
|---|---|---|---|
| 8,040,161 B2 * | 10/2011 | Yanagishima | .......... H02M 1/08 327/108 |
| 2009/0212759 A1 | 8/2009 | Melanson | |
| 2009/0322380 A1 | 12/2009 | Yanagishima et al. | |
| 2012/0223754 A1 | 9/2012 | Lewis | |
| 2013/0249614 A1 | 9/2013 | Zhang et al. | |
| 2015/0015156 A1 | 1/2015 | Angelin et al. | |
| 2015/0280590 A1 | 10/2015 | Maede et al. | |

OTHER PUBLICATIONS

Written Opinion (PCT/ISA/237) dated Apr. 18, 2017, by the Japan Patent Office as the International Searching Authority for International Application No. PCT/JP2017/001579.

Extended European Search Report dated Dec. 19, 2019, issued by the European Patent Office in corresponding European Application No. 17892452.8. (7 pages).

\* cited by examiner

ISOLATOR CIRCUIT

TECHNICAL FIELD

The present invention relates to an isolator circuit having terminals which are galvanically isolated from each other in which a signal is transmitted between the terminals.

BACKGROUND ART

Conventionally, isolator circuits are known which have terminals galvanically isolated from each other in which signals are transmitted between the terminals. For example, Japanese Patent Laying-Open No. 2010-10762 (PTL 1) discloses a signal transmission circuit device which has terminals that are galvanically isolated from each other by a transformer.

CITATION LIST

Patent Literature

PTL 1: Japanese Patent Laying-Open No. 2010-10762

SUMMARY OF INVENTION

Technical Problem

In the signal transmission circuit device disclosed in Japanese Patent Laying-Open No. 2010-10762 (PTL 1), a signal input terminal and a signal output terminal are galvanically isolated from each other by a first transformer, and a comparison signal output terminal and the signal output terminal are galvanically isolated from each other by a second transformer. A control input signal (input pulse signal), input to the signal input terminal, is transmitted as a control output signal (output pulse signal) to the signal output terminal via the first transformer. The output pulse signal is transmitted as a feedback pulse signal to a receiver circuit via the second transformer. The receiver circuit compares whether the input pulse signal and the feedback pulse signal coincide, and outputs, to the comparison signal output terminal, a result of the comparison as a result of comparison between the input pulse signal and the output pulse signal.

Due to the effects of noise or the like occurred in a path through which the output pulse signal is transmitted as the feedback pulse signal, a difference can be generated between the duty ratio of the feedback pulse signal and the duty ratio of the output pulse signal to an extent that it can be difficult for the feedback pulse signal to be treated as the output pulse signal. As a result, determination, using the feedback pulse signal, as to whether the output pulse signal is a desired signal can result in a false determination.

The present invention is made to solve the problems as described above, and has an object to improve the accuracy in determination as to whether a signal, transmitted between terminals galvanically isolated from each other, is a desired signal.

Solution to Problem

In the isolator circuit according to the present invention, a first input pulse signal input to a first terminal is transmitted as an output pulse signal to a second terminal. In the isolator circuit, the output pulse signal is transmitted as a feedback pulse signal to a third terminal. The isolator circuit includes a first isolator, an analog-to-digital (AD) converter, and a second isolator. The first isolator is configured to galvanically isolate the first terminal from the second terminal. The first isolator is configured to receive the first input pulse signal and output the output pulse signal to the second terminal. The AD converter is configured to output a digital signal corresponding to the duty ratio of the output pulse signal. The second isolator is configured to galvanically isolate the second terminal from the third terminal. The second isolator is configured to receive the digital signal and output the feedback pulse signal to the third terminal.

"Galvanically isolating" two elements from each other refers to a fact that a transmission path for a signal from one element to the other has portions that are not connected to each other by a conductor.

Advantageous Effects of Invention

In the isolator circuit according to the present invention, the duty ratio of the output pulse signal is converted into a digital signal by the AD converter, and the digital signal is transmitted as a feedback pulse signal. Even if the duty ratio of the pulse signal, representing the digital signal, is varied, the pulse signal is unlikely to change between high and low. Thus, a change in the digital value represented by the pulse signal is unlikely to occur. A difference is unlikely to occur between the feedback pulse signal and the duty ratio of the output pulse signal to an extent it can be difficult for the feedback pulse signal to be treated as the duty ratio of the output pulse signal. As a result, use of the feedback pulse signal allows for highly accurate determination as to whether the duty ratio of the output pulse signal has a desired value.

In other words, according to the isolator circuit of the present invention, the accuracy in determination is improved as to whether a signal, transmitted between terminals galvanically isolated from each other, is a desired signal.

DESCRIPTION OF EMBODIMENTS

Figure 1:
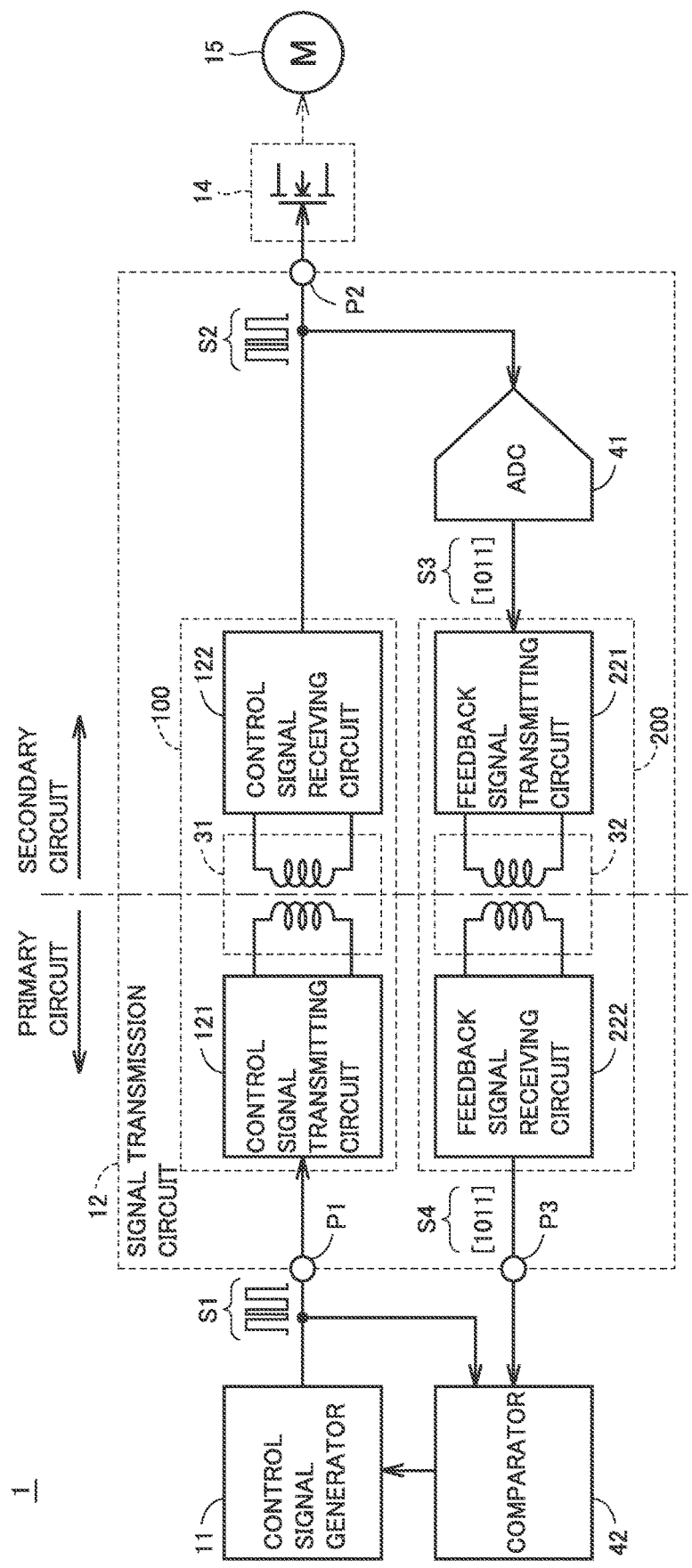
FIG. 1 is an example functional block diagram of an isolator circuit according to Embodiment 1.

Hereinafter, embodiments of the present invention will be described, with reference to the accompanying drawings. Note that like reference signs are used to refer to like or corresponding parts in the drawings, and the description thereof will, in principle, not be repeated.

Embodiment 1

FIG. 1 is an example functional block diagram of an isolator circuit 1 according to Embodiment 1. As shown in FIG. 1, in isolator circuit 1, an input pulse signal S1 is input to a terminal P1, and transmitted as an output pulse signal S2 to a terminal P2. In isolator circuit 1, output pulse signal S2 is transmitted as a feedback pulse signal S4 to a terminal P3. Isolator circuit 1 includes a control signal generator 11, a signal transmission circuit 12, and a comparator 42. A primary circuit shown in FIG. 1 refers to a circuit that is galvanically isolated, by transformers 31 and 32, from terminal P3 to which output pulse signal S2 is transmitted. A secondary circuit refers to a circuit that is galvanically isolated, by transformers 31 and 32, from terminal P1 to which input pulse signal S1 is input.

Control signal generator 11 outputs input pulse signal S1 to terminal P1 of signal transmission circuit 12. Input pulse signal S1 is, for example, a PWM signal. Signal transmission circuit 12 outputs output pulse signal S2 through terminal P2. Output pulse signal S2 is output to a power semiconductor 14 which controls a motor 15. Power semiconductor 14 is switched between on and off by output pulse signal S2. Signal transmission circuit 12 outputs feedback pulse signal S4 to comparator 42 through terminal P3. Comparator 42 compares the duty ratio of input pulse signal S1 with feedback pulse signal S4 and outputs a comparison result to control signal generator 11. Specifically, comparator 42 outputs a difference between the duty ratio of input pulse signal S1 and feedback pulse signal S4.

Signal transmission circuit 12 includes isolators 100 and 200, and an Analog-to-Digital Converter (ADC) 41. Isolator 100 galvanically isolates terminals P1 and P2 from each other. Isolator 100 receives input pulse signal S1 and outputs output pulse signal S2 to terminal P2. AD converter 41 outputs to isolator 200 a digital signal S3 that is corresponding to the duty ratio of output pulse signal S2. Isolator 200 galvanically isolates terminals P2 and P3 from each other. Isolator 200 receives digital signal S3 and outputs feedback pulse signal S4 to terminal P3.

Isolator 100 includes a control signal transmitting circuit 121, transformer 31, and a control signal receiving circuit 122. Control signal transmitting circuit 121 receives input pulse signal S1 and outputs a pulse signal to transformer 31 for transmission to control signal receiving circuit 122. For example, control signal transmitting circuit 121 temporarily saves (buffers) input pulse signal S1, converts input pulse signal S1 into a pulse signal that is suitable for transmission via transformer 31, detects an edge of input pulse signal S1, and outputs rising/falling edge information obtained by the edge detection. A pulse signal corresponding to input pulse signal S1 is output to transformer 31. In transformer 31, the pulse signal from control signal transmitting circuit 121 is transmitted from one coil to the other that are galvanically isolated from each other. Control signal receiving circuit 122 buffers the pulse signal from transformer 31, and demodulates it to output pulse signal S2 that is for controlling power semiconductor 14.

Isolator 200 includes a feedback signal transmitting circuit 221, transformer 32, and a feedback signal receiving circuit 222. Feedback signal transmitting circuit 221 outputs to transformer 32 a pulse signal which is corresponding to digital signal S3. In transformer 32, the pulse signal from feedback signal transmitting circuit 221 is transmitted from one coil to the other that are galvanically isolated from each other. Feedback signal receiving circuit 222 buffers the pulse signal from transformer 32, and outputs feedback pulse signal S4 to terminal P3.

Figure 2:
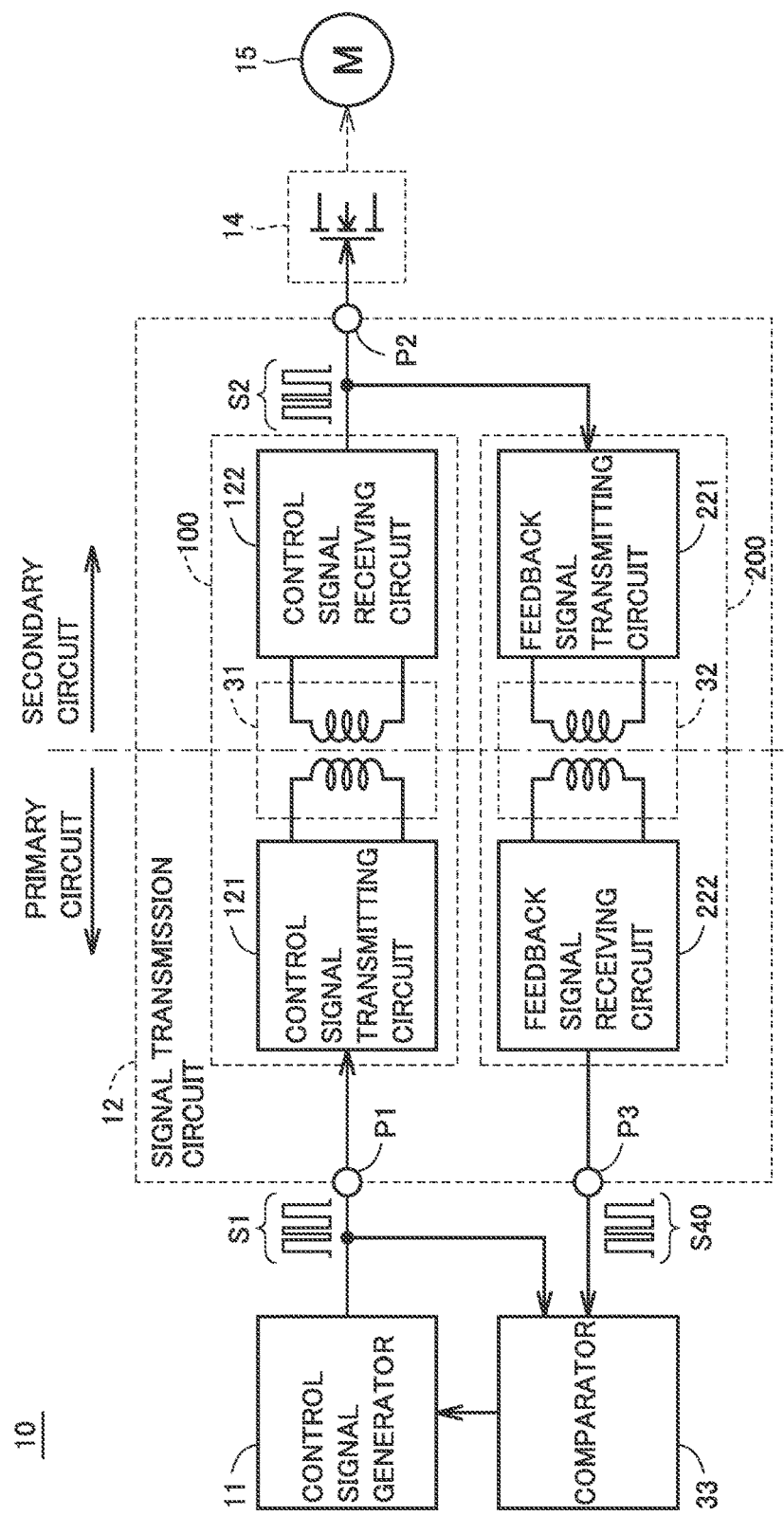
FIG. 2 is an example functional block diagram of an isolator circuit according to Comparative Example.

FIG. 2 is an example functional block diagram of an isolator circuit 10 according to Comparative Example. An isolator circuit 10 is different from isolator circuit 1 in that isolator circuit 10 causes an output pulse signal S2 to be input to a feedback signal transmitting circuit 221 without ADC intervention, and a comparator 33 compares an input pulse signal S1 with a feedback pulse signal S40. The other configurations of isolator circuit 10 are the same as those of isolator circuit 1, and thus the description thereof will not be repeated.

In isolator circuit 10, noise may occur in a path through which output pulse signal S2 is transmitted as feedback pulse signal S40. Examples of the noise can include noise which is propagated through a substrate or ground due to switching control over the power semiconductor 14 between on and off, noise due to transmission characteristics of transformer 32, or noise introduced into transformer 32 from outside the isolator circuit 10. In such a case, a difference can occur between the duty ratio of feedback pulse signal S40 and the duty ratio of output pulse signal S2 to an extent that it can be difficult for feedback pulse signal S40 to be treated as output pulse signal S2. As a result, when feedback pulse signal S40 is used to determine whether output pulse signal S2 is a desired signal, a false determination can result.

Therefore, in isolator circuit 1 shown in FIG. 1, ADC 41 converts the duty ratio of output pulse signal S2 into digital signal S3, and digital signal S3 is transmitted as feedback pulse signal S4. Even if the duty ratio of a pulse signal representing digital signal S3 is changed by noise, the pulse signal is unlikely to switch between high and low. Thus, a change in the digital value, represented by the pulse signal, is unlikely to occur. A difference is unlikely to occur between feedback pulse signal S4 and the duty ratio of output pulse signal S2 to an extent that it can be difficult for feedback pulse signal S4 to be treated as the duty ratio of output pulse signal S2. As a result, the use of feedback pulse signal S4 allows for highly accurate determination as to whether the duty ratio of the output pulse signal has a desired value. In other words, according to isolator circuit 1, the accuracy in determination is improved as to whether a signal, transmitted between terminals P1 and P2 that are galvanically isolated from each other, is a desired signal.

Figure 3:
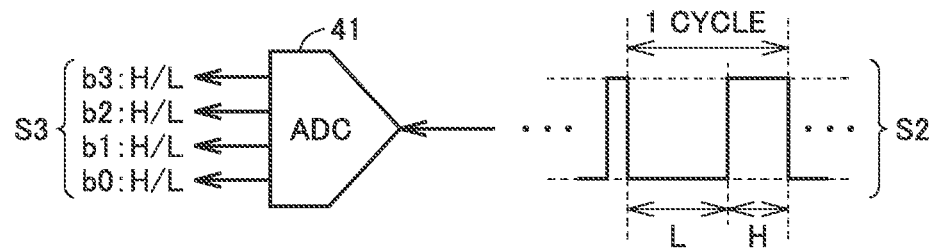
FIG. 3 is a diagram for illustrating details of functionality of an ADC of FIG. 1.
Figure 4:
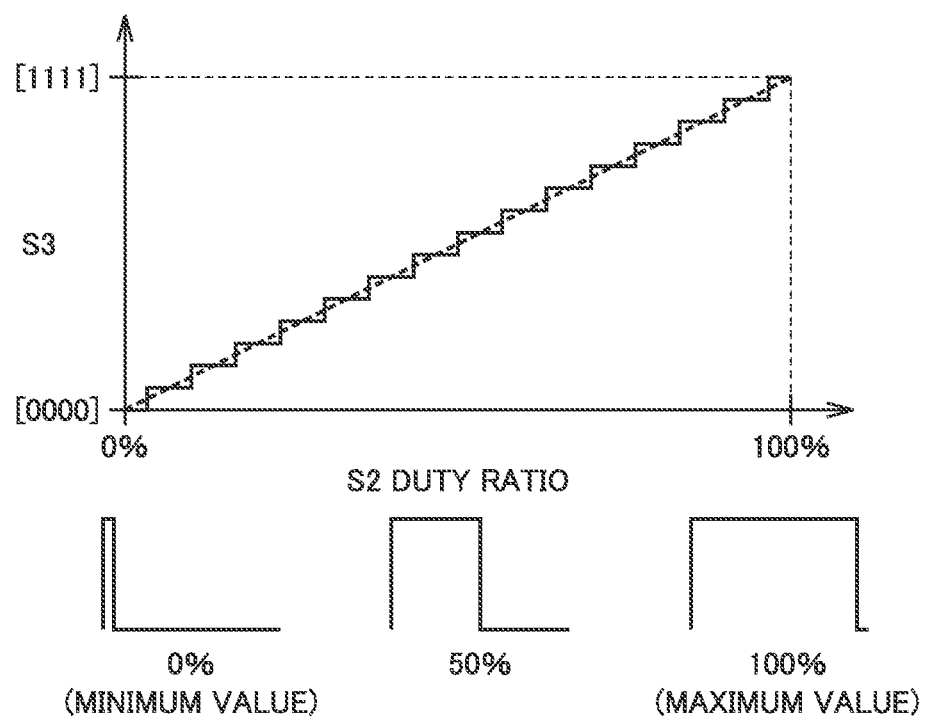
FIG. 4 is a diagram showing a correspondence between a duty ratio of an output pulse signal and a digital signal.

FIG. 3 is a diagram for illustrating details of functionality of ADC 41. FIG. 4 is a diagram showing a correspondence between the duty ratio of output pulse signal S2 and the digital signal. In FIGS. 3 and 4, the duty ratio of output pulse signal S2 is shown to be converted into a 4-bit digital signal. Consider the duty ratio as a proportion (%) of a time H, where a pulse signal is high, to one cycle (H+L). Then, the duty ratio of output pulse signal S2 can be represented as 100×H/(L+H). As shown in FIG. 3, the duty ratio is converted by ADC 41 into a digital signal having bits b0, b1, b2, and b3. ADC 41 converts the duty ratio of output pulse signal S2 into a digital signal, based on the correspondence shown in FIG. 4. The number of bits included in the digital signal output from ADC 41 is not limited to 4, and may be 3 or less, or 5 or more.

Figure 5:
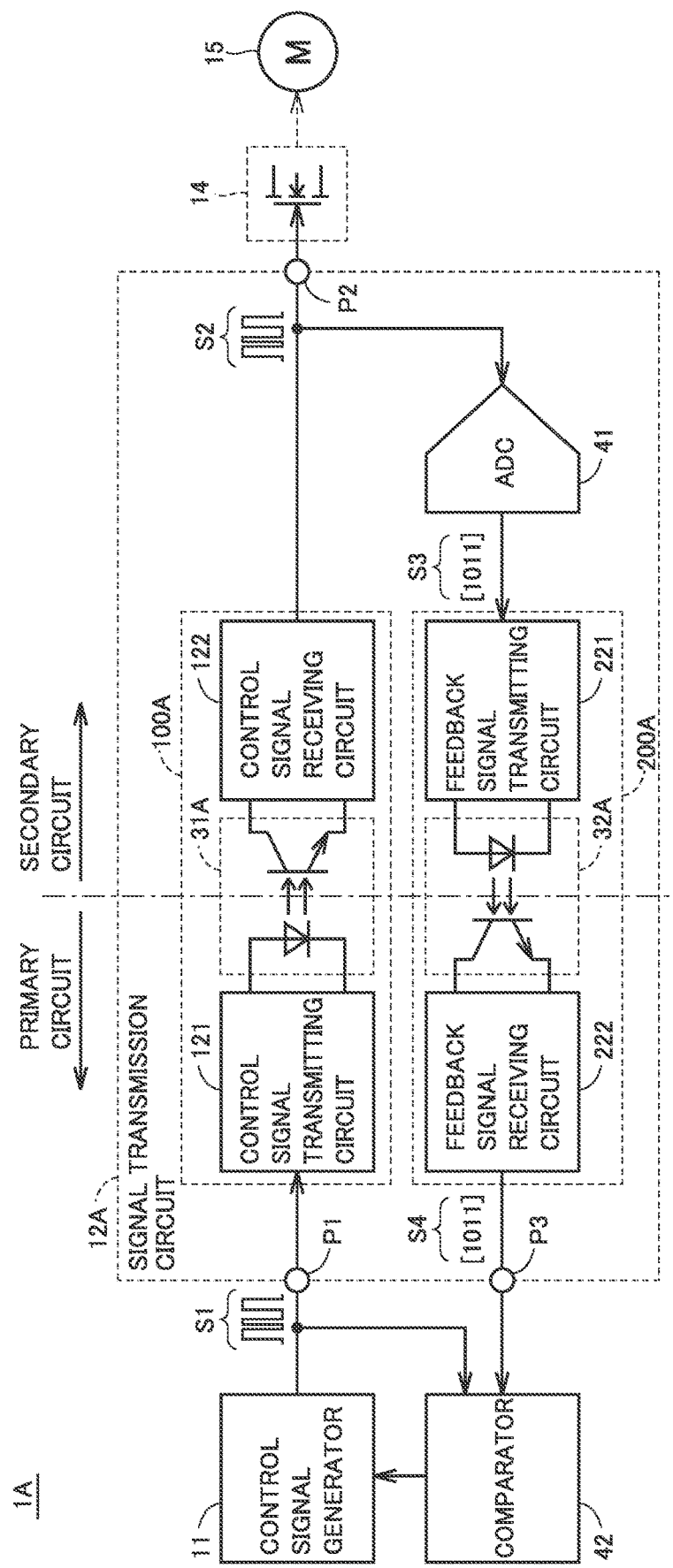
FIG. 5 is an example functional block diagram of an isolator circuit according to a variation of Embodiment 1.

Embodiment 1 has been described with reference to the isolators each including a transformer as an isolator. The isolator included in the isolator may be a photocoupler. FIG. 5 is an example functional block diagram of an isolator circuit 1A according to a variation of Embodiment 1. As shown in FIG. 5, isolators 100A and 200A include photocouplers 31A and 32A, respectively. The configuration of isolator circuit 1A is the same as isolator circuit 1 shown in FIG. 1, except for photocouplers 31A and 32A. Thus the description of the configuration will not be repeated.

As described above, according to the isolator circuit of Embodiment 1 and the variation thereof, the accuracy in determination can be improved as to whether a signal, transmitted between terminals that are galvanically isolated from each other, is a desired signal.

Embodiment 2

Figure 6:
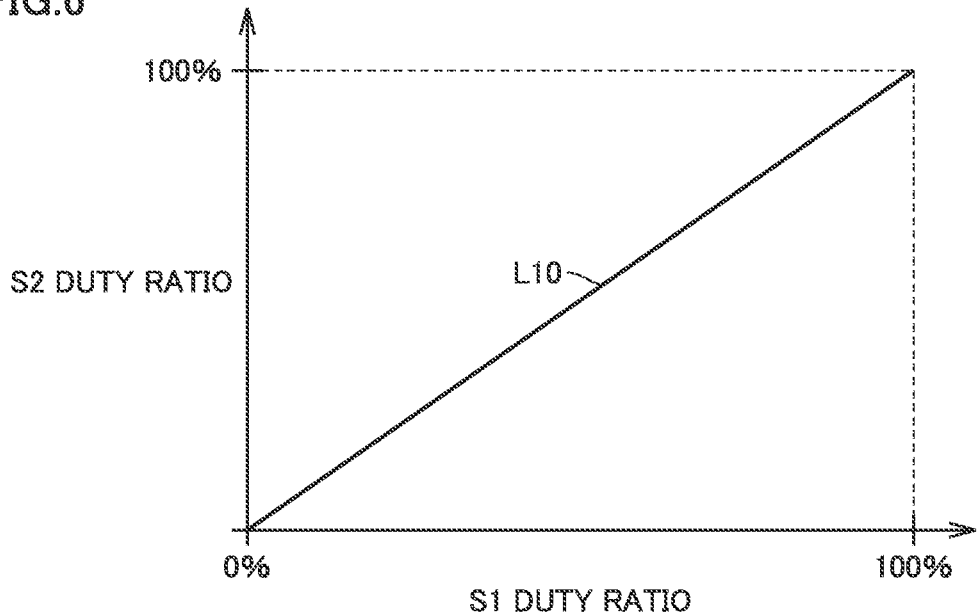
FIG. 6 is a diagram showing a correspondence between a duty ratio of an input pulse signal and a duty ratio of an output pulse signal.
Figure 7:
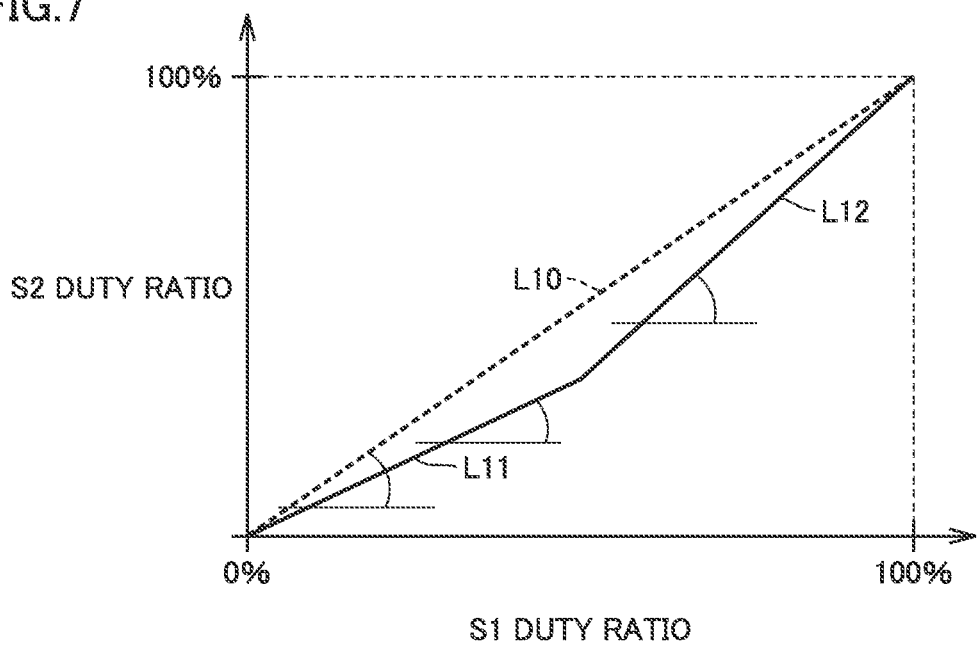
FIG. 7 is a diagram showing a correspondence between a duty ratio of an input pulse signal and a duty ratio of an output pulse signal when there is a linearity error between them.

From the standpoint of accuracy in signal transmission, it is desirable that the duty ratio of an input pulse signal and the duty ratio of an output pulse signal are equal. In other words, it is desirable that the correspondence between the input pulse signal and the output pulse signal can be represented as a straight line L10 having a slope of 1 that is passing through the origin, as shown in FIG. 6. However, a linearity error may arise in the slope of the straight line representing the correspondence between the duty ratio of the input pulse signal and the duty ratio of the output pulse signal. In other words, the correspondence between the duty ratio of the input pulse signal and the duty ratio of the output pulse signal may be represented as a straight line L11 having a slope of less than 1 or a straight line L12 having a slope of more than 1, as shown in FIG. 7, due to noise or the like caused by characteristics of the isolator.

Figure 8:
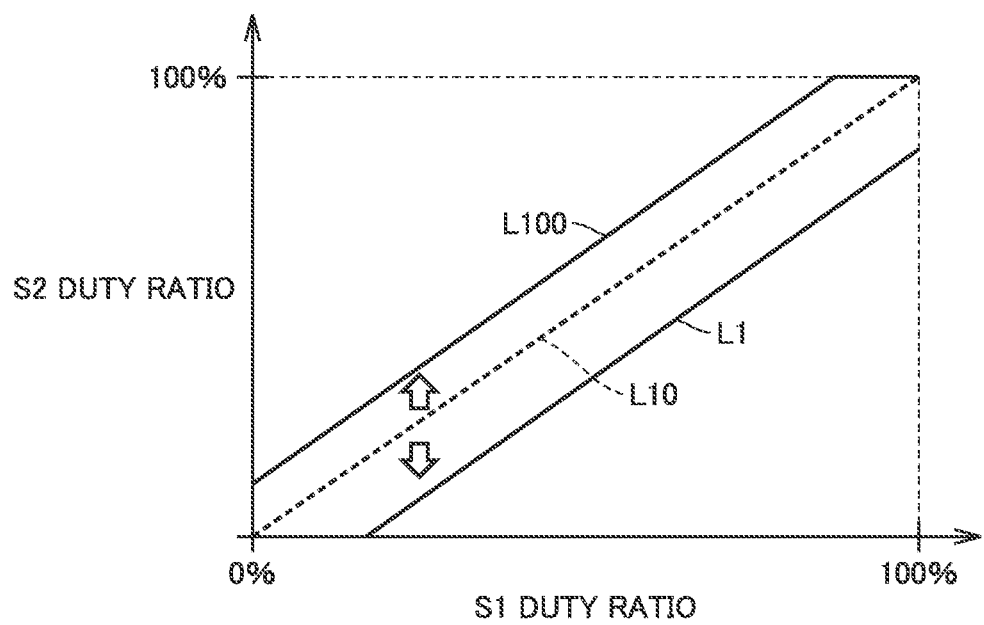
FIG. 8 is a diagram showing a correspondence between a duty ratio of an input pulse signal and a duty ratio of an output pulse signal when an offset arises between them.

Moreover, due to the effects of noise or the like, an offset may arise between the duty ratio of the input pulse signal and the duty ratio of the output pulse signal. In other words, the duty ratio of the output pulse signal may increase, by a certain value, greater than the duty ratio of the input pulse signal, as shown by the correspondence represented by a straight line L100 shown in FIG. 8, or the duty ratio of the output pulse signal may decrease, by a certain value, less than the duty ratio of the input pulse signal, as shown by straight line L10.

As an linearity error or offset arises in the correspondence between the duty ratio of the input pulse signal and the duty ratio of the output pulse signal, the duty ratio of the output pulse signal ends up deviating from a desired value.

Embodiment 2 will be described with reference to a configuration in which the difference between the duty ratio of the input pulse signal and the duty ratio of the output pulse signal (the feedback pulse signal) is used to correct the duty ratio of the input pulse signal, and make the duty ratio of the output pulse signal closer to a desired value.

Figure 9:
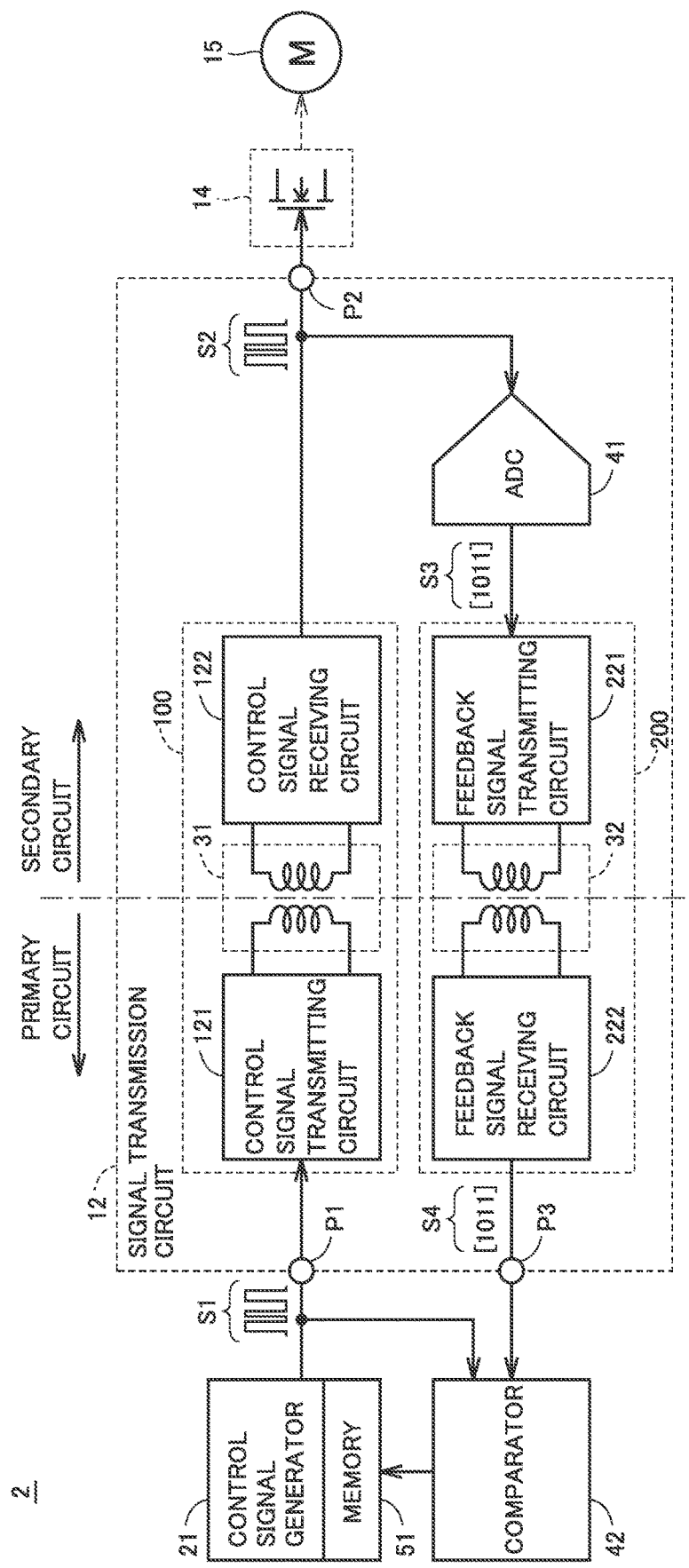
FIG. 9 is an example functional block diagram of an isolator circuit according to Embodiment 2.

FIG. 9 is an example functional block diagram of an isolator circuit 2 according to Embodiment 2. Isolator circuit 2 includes a control signal generator 21, in place of control signal generator 11 included in isolator circuit 1 shown in FIG. 1. The configuration of isolator circuit 2 is the same as isolator circuit 1, except for control signal generator 21. Thus, the description of the configuration will not be repeated.

As shown in FIG. 9, control signal generator 21 includes a memory 51. Control signal generator 21 saves, into memory 51, the duty ratio of an input pulse signal S1, associating it with a result of comparison (a difference between the duty ratio of input pulse signal S1 and the feedback pulse signal) by a comparator 42.

Figure 10:
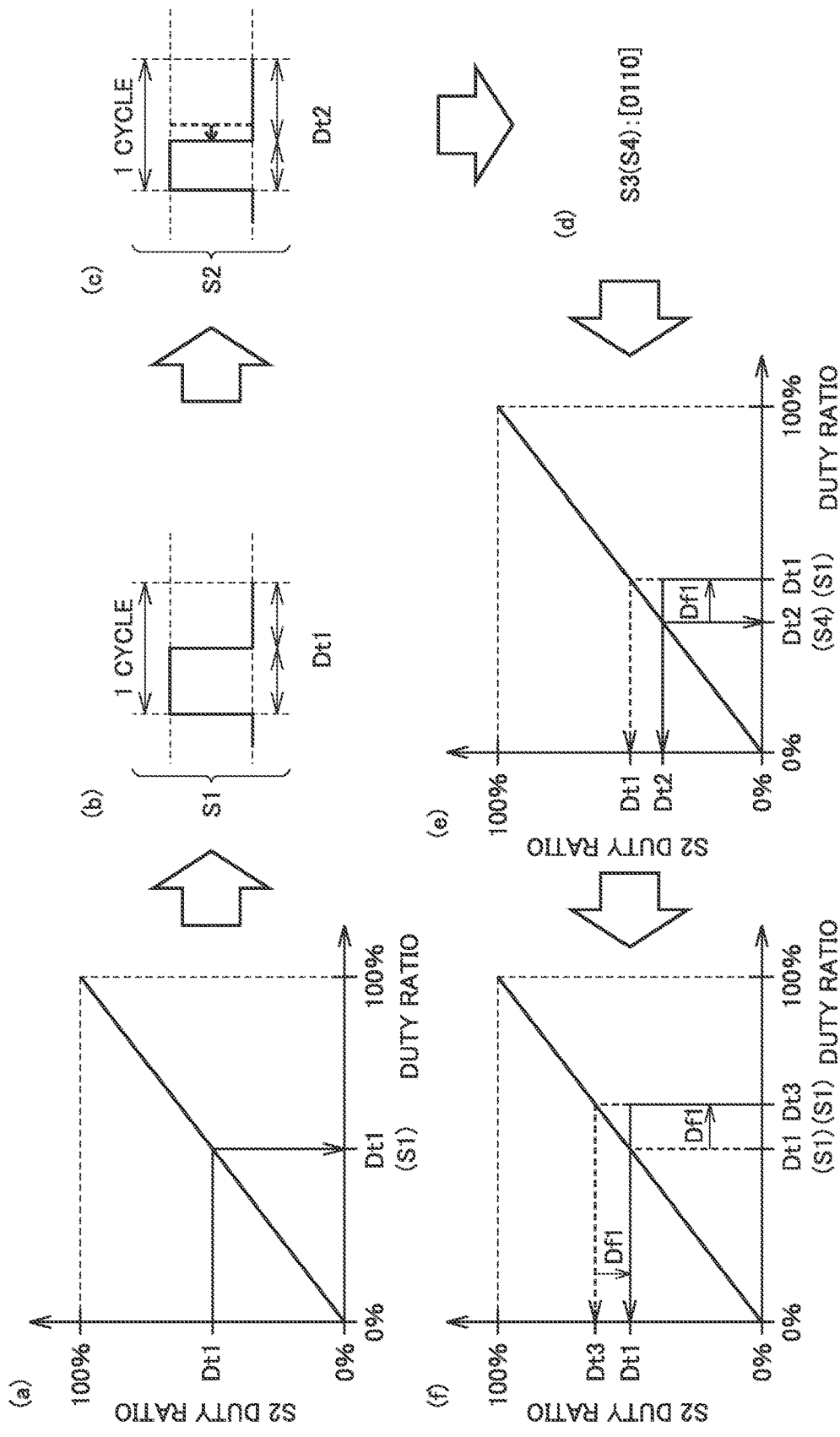
FIG. 10 is a diagram showing a process of correcting the duty ratio of an input pulse signal.

FIG. 10 is a diagram showing a process of correcting the duty ratio of input pulse signal S1. Referring to FIGS. 9 and 10, in order to output to a power semiconductor 14 a control signal having a duty ratio Dt1, an output pulse signal S2 needs to have duty ratio Dt1. Suppose that input pulse signal S1 has a duty ratio Dt1, if input pulse signal S1 is transmitted as output pulse signal S2 without being effected by noise or the like, the duty ratio of output pulse signal S2 is also Dt1 ((a) of FIG. 10). However, in practice, due to the effects of noise or the like, input pulse signal S1 ((b) of FIG. 10) having duty ratio Dt1, output from control signal generator 21 at time T1, may be transmitted as output pulse signal S2 ((c) of FIG. 10) which has duty ratio Dt2 (less than Dt1).

Duty ratio Dt2 of output pulse signal S2 is converted into a digital signal S3 shown in (d) of FIG. 10, and then output as a feedback pulse signal S4 to comparator 42. Comparator 42 outputs to control signal generator 21 a difference Df1 (equals to Dt1 minus Dt2) between duty ratios Dt1 and Dt2, as shown in (e) of FIG. 10. Control signal generator 21 uses difference Df1 to correct the duty ratio of input pulse signal S1. In other words, control signal generator 21 determines the duty ratio of input pulse signal S1, which is to be output after time T1, to be a duty ratio Dt3 obtained by adding the difference Df1 to duty ratio Dt1 ((f) of FIG. 10). If there is no factor that changes the duty ratio, such as noise, input pulse signal S1 having duty ratio Dt3 is transmitted as output pulse signal S2 having duty ratio Dt1 which is less than duty ratio Dt3 by difference Df1.

As shown in (f) of FIG. 10, control signal generator 21 pre-adds a difference between the duty ratio of input pulse signal S1 and feedback pulse signal S4, the difference being corresponding to desired output pulse signal S2, to a duty ratio of a subsequent input pulse signal S1, thereby making the duty ratio of output pulse signal S2 closer to a desired value. FIG. 10 shows a case where the duty ratio of input pulse signal S1 decreases before being transmitted to a terminal P2 as output pulse signal S2. In this case, the difference between the duty ratio of input pulse signal S1 and feedback pulse signal S4 yields a positive value. Thus, pre-adding this difference to the duty ratio of a subsequent input pulse signal S1 means increasing the duty ratio of the subsequent input pulse signal S1 greater than a desired value. Even if the duty ratio of input pulse signal S1 decreases before being transmitted to terminal P2 as output pulse signal S2, the duty ratio of output pulse signal S2 can be made closer to a desired value.

Conversely, if the duty ratio of input pulse signal S1 increases before being transmitted to terminal P2 as output pulse signal S2, a difference between the duty ratio of input pulse signal S1 and feedback pulse signal S4 yields a negative value. Pre-adding this difference to the duty ratio of input pulse signal S1 means decreasing the duty ratio of input pulse signal S1 less than a desired value. Even if the duty ratio of input pulse signal S1 increases before being transmitted to terminal P2 as output pulse signal S2, the duty ratio of output pulse signal S2 can be made closer to a desired value.

In Embodiment 2, control signal generator 21 associates duty ratio Dt1 of input pulse signal S1 and difference Df1 between duty ratio Dt1 and feedback pulse signal S4, and saves them as correction data into memory 51. Control signal generator 21 refers to the correction data and is thereby allowed to know, when outputting input pulse signal S1 having duty ratio Dt1, that the duty ratio of output pulse signal S2 has changed to Dt1−Df1. In Embodiment 2, when the duty ratio of a desired output pulse signal S2 is Dt1, difference Df1 saved in memory 51 is used to pre-set the duty ratio for a subsequent input pulse signal S1 to Dt1+Df1, thereby making the duty ratio of output pulse signal S2 closer to Dt1. When a difference associated with the duty ratio of desired output pulse signal S2 is saved in memory 51 as such, there is no need to convert the duty ratio of output pulse signal S2 into digital signal S3 and compare the duty ratio of input pulse signal S1 with feedback pulse signal S4. For the correction of input pulse signal S1, there is no need to wait for the completion of conversion of the duty ratio of output pulse signal S2 to digital signal S3 and comparison of the duty ratio of input pulse signal S1 with feedback pulse signal S4, thereby shortening the time required to correct input pulse signal S1.

As described above, according to the isolator circuit of Embodiment 2, as with Embodiment 1, the accuracy in determination can be improved as to whether a signal, transmitted between terminals that are galvanically isolated from each other, is a desired signal.

According to the isolator circuit of Embodiment 2, the signal, transmitted between terminals that are galvanically isolated from each other, can be corrected so as to reduce the deviation of the signal from a desired signal.

Variation of Embodiment 2

Embodiment 2 has been described with reference to the control signal generator using the correction data saved in the memory to correct the input pulse signal and saving the correction data in the memory. A variation of Embodiment 2 will be described with reference to the isolator circuit having operation modes including a normal mode and a test mode. In the normal mode, the control signal generator uses correction data saved in the memory to correct an input pulse signal. In the test mode, the control signal generator saves correction data into the memory.

Duty ratios of input pulse signals obtained during the test mode are set to those corresponding to digital signals that can be output from the ADC. For example, if the ADC outputs a 4-bit digital signal, a duty ratio of an input pulse signal is set to one of 16 duty ratios from 0% to 100%. Correction data for each duty ratio is saved into the memory. The test mode is executed, for example, when the isolator circuit starts up and before the normal mode starts.

Figure 11:
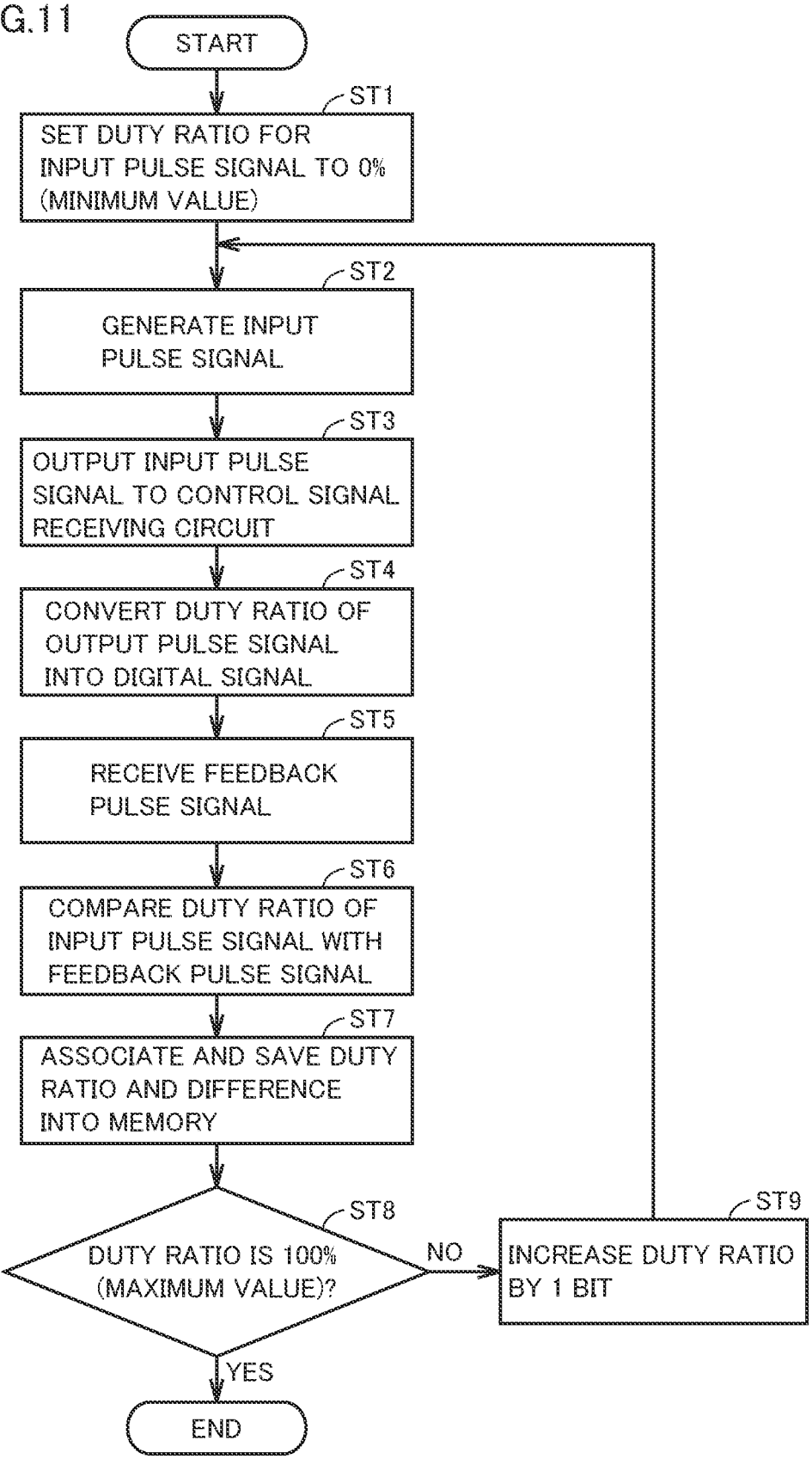
FIG. 11 is a flowchart showing a flow of processing performed in a test mode.

FIG. 11 is a flowchart showing a flow of processing performed in the test mode. Hereafter, a step is simply referred to as ST. At ST1, the control signal generator sets the duty ratio for an input pulse signal to 0% (minimum value). At ST2, the control signal generator generates an input pulse signal having the duty ratio set at ST1. At ST3, the control signal generator outputs the input pulse signal to the control signal receiving circuit. At ST4, the ADC converts the duty ratio of the output pulse signal into a digital signal. At ST5, the comparator receives a feedback pulse signal. At ST6, the comparator compares the duty ratio of the input pulse signal with the feedback pulse signal, and outputs a difference between the duty ratio of the input pulse signal and the feedback pulse signal to the control signal generator. At ST7, the control signal generator associates the duty ratio of the input pulse signal and a result of comparison (the difference between the duty ratio of the input pulse signal and the feedback pulse signal) by the comparator, and saves them into the memory. The control signal generator, at ST8, determines whether the duty ratio of the input pulse signal is 100% (maximum value). If the duty ratio of the input pulse signal is not 100% (maximum value) (NO at ST8), at ST9 the control signal generator increases the duty ratio by 1 step (1 bit) and returns the processing back to ST2. If the duty ratio of the input pulse signal is 100% (maximum value) (YES at ST8), the test mode ends.

The control signal generator operates in the test mode prior to operating in the normal mode, thereby allowing, in the normal mode, the use of the correction data saved in the memory to correct the duty ratio of an input pulse signal so that the duty ratio of an output pulse signal has a desired value. In the normal mode, there is no need to convert the duty ratio of output pulse signal S2 into digital signal S3 and compare the duty ratio of the input pulse signal with the feedback pulse signal. For the correction of input pulse signal S1, there is no need to wait for the completion of the conversion of the duty ratio of output pulse signal S2 into digital signal S3 and the comparison of the duty ratio of an input pulse signal and a feedback pulse signal. Thus, in the normal mode, a time required for the correction of input pulse signal S1 can always be shortened.

As described above, according to the isolator circuit of the variation of Embodiment 2, the same advantageous effects as those of Embodiment 1 and Embodiment 2 can be obtained.

According to the isolator circuit of the variation of Embodiment 2, in the normal mode, a time required for the correction of a signal for transmission between the terminals of the isolator circuit which are galvanically isolated from each other, can always be shortened.

Embodiment 3

Figure 12:
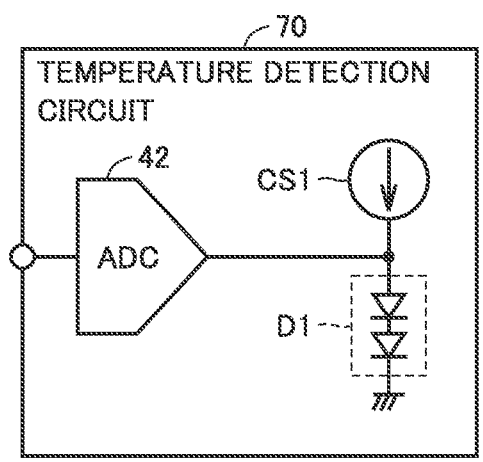
FIG. 12 is an example functional block diagram of a temperature detection circuit.

The ADC included in the isolator circuit according to the present invention may be included in a circuit other than the isolator circuit. For example, a circuit, which controls a power semiconductor, handles voltages and currents that are greater than those used in a circuit obtained by a typical semiconductor process. The circuit, which controls the power semiconductor, is often equipped with a temperature detection circuit 70 as shown in FIG. 12 to detect an atypical rise in temperature of the circuit. Temperature detection circuit 70 includes a constant current source CS1, a diode D1, and an ADC 42. Diode D1 has an anode connected to constant current source CS1. Diode D1 has a cathode grounded. Current is supplied from constant current source CS1 to diode D1. A forward falling voltage of diode D1 varies with temperature. ADC 42 converts the forward falling voltage into a digital signal and outputs the digital signal.

Embodiment 3 will be described with reference to a configuration in which an ADC included in a temperature detection circuit is used to convert the duty ratio of an output pulse signal into a digital signal. The ADC is shared between the isolator circuit according to the present invention and another circuit. Accordingly, there is no need to newly prepare an ADC to implement the isolator according to the present invention. Thus, an expansion of the area of the isolator circuit can be inhibited.

Embodiment 3 is different from Embodiment 2 in that the ADC according to Embodiment 3 is shared between the temperature detection circuit and the isolator circuit, and operation modes of the isolator circuit according to Embodiment 3 include a normal mode and a test mode. When the operation mode of the isolator circuit is the test mode, the ADC is disconnected from the temperature detection circuit by a switch and functions as a component of the isolator circuit. When the operation mode of the isolator circuit is the normal mode, the ADC is disconnected from the isolator circuit by a switch and functions as a component of the temperature detection circuit. Other configurations of Embodiment 3 are the same as those described in Embodiment 2, and thus the description thereof will not be repeated.

Figure 13:
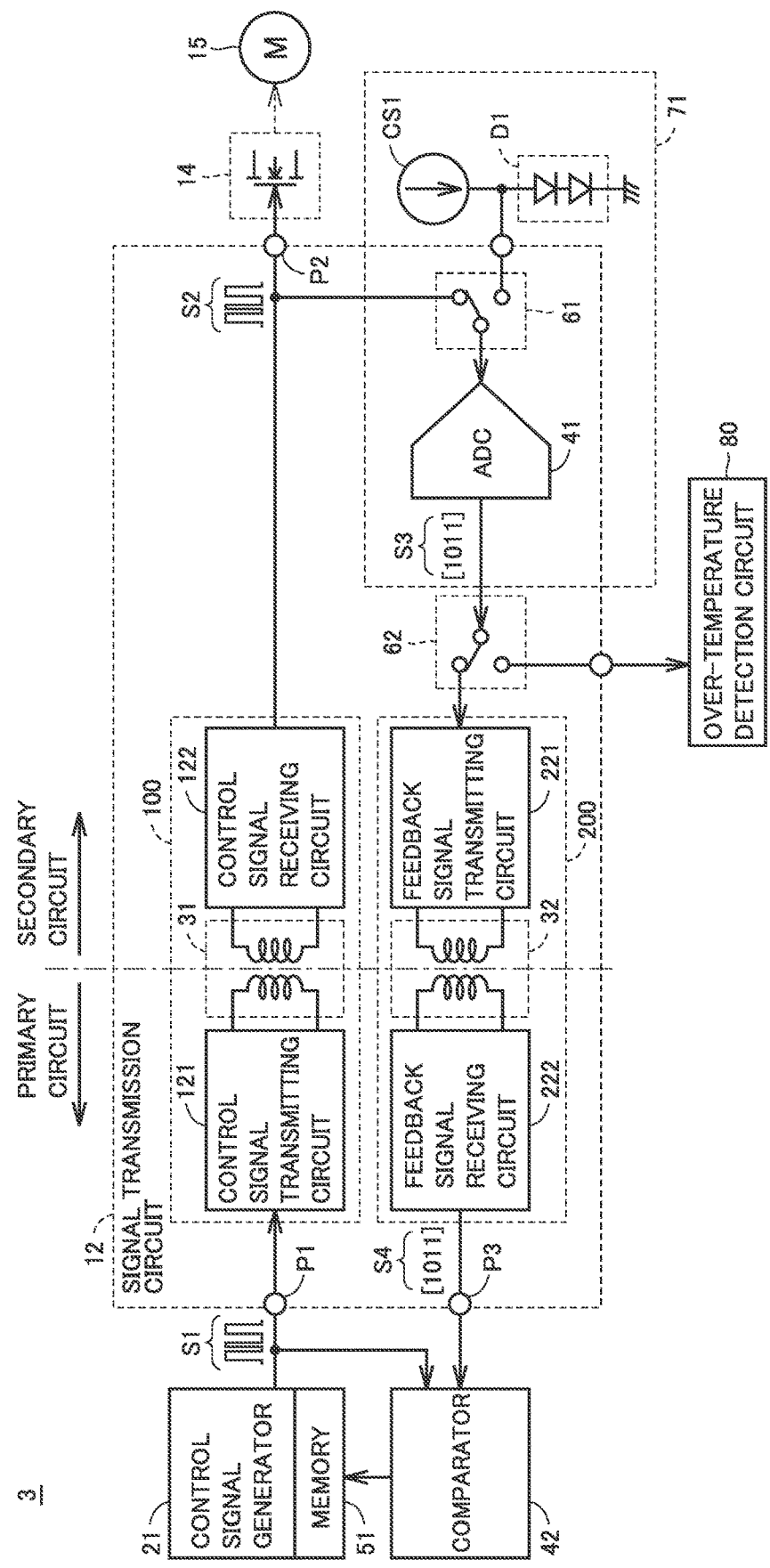
FIG. 13 is an example functional block diagram of an isolator circuit according to Embodiment 3 in a test mode.
Figure 14:
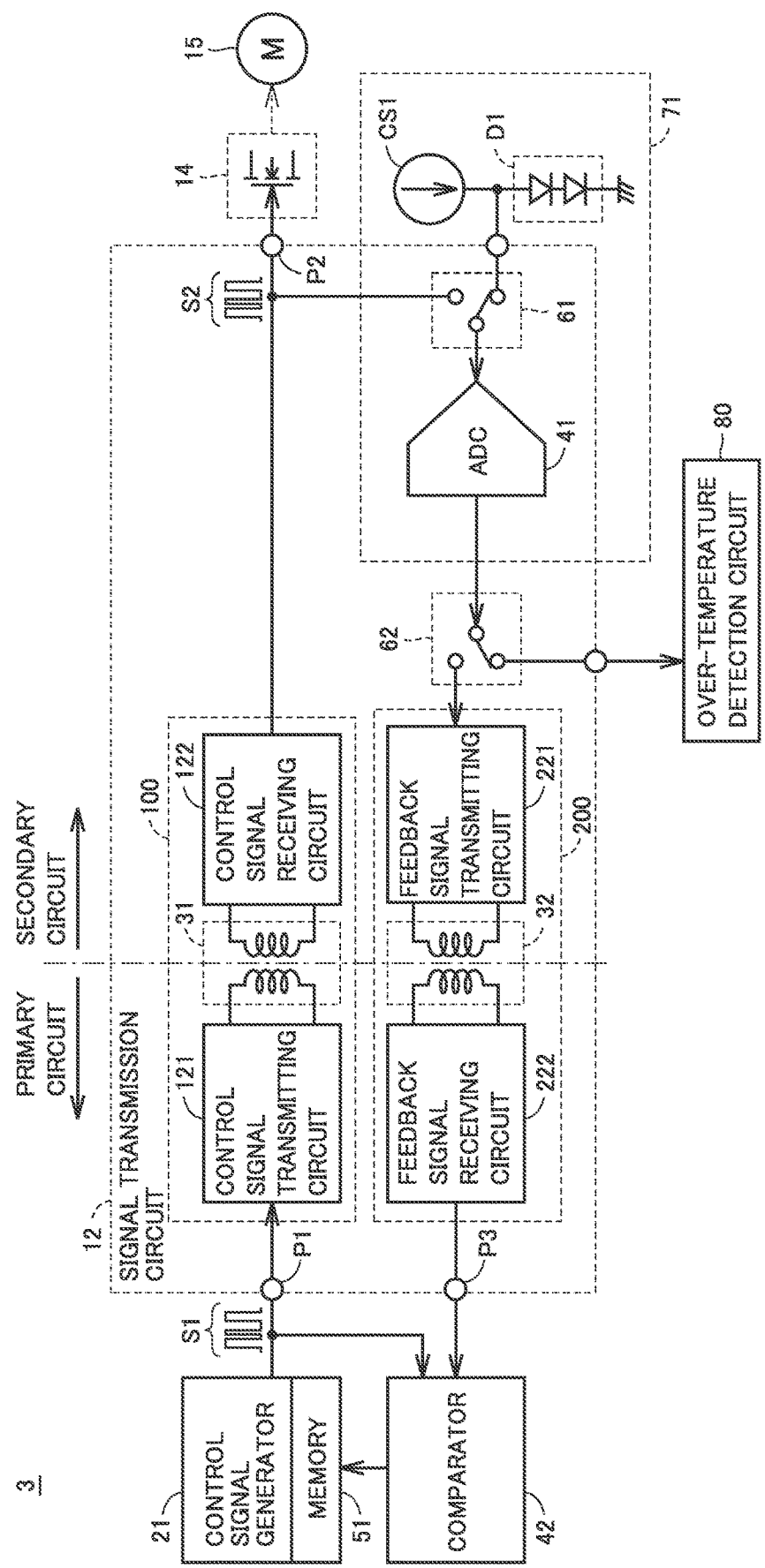
FIG. 14 is an example functional block diagram of the isolator circuit according to Embodiment 3 in a normal mode.

FIGS. 13 and 14 are example functional block diagrams each showing an isolator circuit 3 according to Embodiment 3. Isolator circuit 3 shown in FIGS. 13 and 14 includes the configuration of isolator circuit 2 with switches 61 and 62 added thereto. Operation modes of isolator circuit 3 include a normal mode and a test mode, as with the variation of Embodiment 2. In FIG. 13, the operation mode of isolator circuit 3 is the test mode. In FIG. 14, the operation mode of isolator circuit 3 is the normal mode.

As shown in FIGS. 13 and 14, ADC 41 is shared between isolator circuit 3 and a temperature detection circuit 71. Switch 61 switches connection between an input terminal of ADC 41 and isolator 100 and switches connection between the input terminal of ADC 41 and the anode of diode D1. Switch 62 switches connection between an output terminal of ADC 41 and isolator 200 and switches connection between the output terminal of ADC 41 and an over-temperature detection circuit 80. Over-temperature detection circuit 80 protects isolator circuit 3 when the temperature of isolator circuit 3 becomes excessively high.

In FIG. 13, switch 61 connects the input terminal of ADC 41 and isolator 100. Switch 62 connects the output terminal of ADC 41 and isolator 200. In FIG. 13, ADC 41 is disconnected from temperature detection circuit 71 and functions as a component of isolator circuit 3. In FIG. 13, the duty ratio of an output pulse signal S2 is converted into a digital signal S3 by ADC 41. Digital signal S3 is transmitted as a feedback pulse signal S4 to a comparator 42. Control signal generator 21 receives a comparison result from comparator 42 and saves correction data into memory 51.

In FIG. 14, switch 61 connects the input terminal of ADC 41 and the anode of diode D1. Switch 62 connects the output terminal of ADC 41 and over-temperature detection circuit 80. In FIG. 14, ADC 41 is disconnected from isolator circuit 3 and functions as a component of temperature detection circuit 71. ADC 41 converts a forward falling voltage of diode D1 into digital signal and outputs the digital signal to over-temperature detection circuit 80. In FIG. 14, control signal generator 21 uses the correction data saved in memory 51 to correct and output an input pulse signal S1.

Switches 61 and 62 may be controlled by control signal generator 21 or by control signal receiving circuit 122. Switches 61 and 62 each may determine, on its own, the end of the series of steps performed in the test mode shown in FIG. 11 and switch the connections.

As described above, the isolator circuit according to Embodiment 3 can yield the same advantages effects as those of Embodiment 2 and Embodiment 2. Moreover, according to the isolator circuit of Embodiment 3, an expansion of the area of the isolator circuit can be inhibited.

Variation of Embodiment 3

Embodiment 3 has been described with reference to switching, by switches, the connection points to which the input terminal and output terminal of the ADC are respectively connected, and thereby controlling whether to disconnect the ADC from the isolator circuit and cause the ADC to function as a component of another circuit. A variation of Embodiment 3 will be described with reference to switching, by switches, the connection points to which the input terminal of the ADC and a terminal, which is the output end of the feedback pulse signal, are respectively connected, and thereby controlling whether to disconnect the ADC from the isolator circuit and cause the ADC to function as a component of another circuit.

Figure 15:
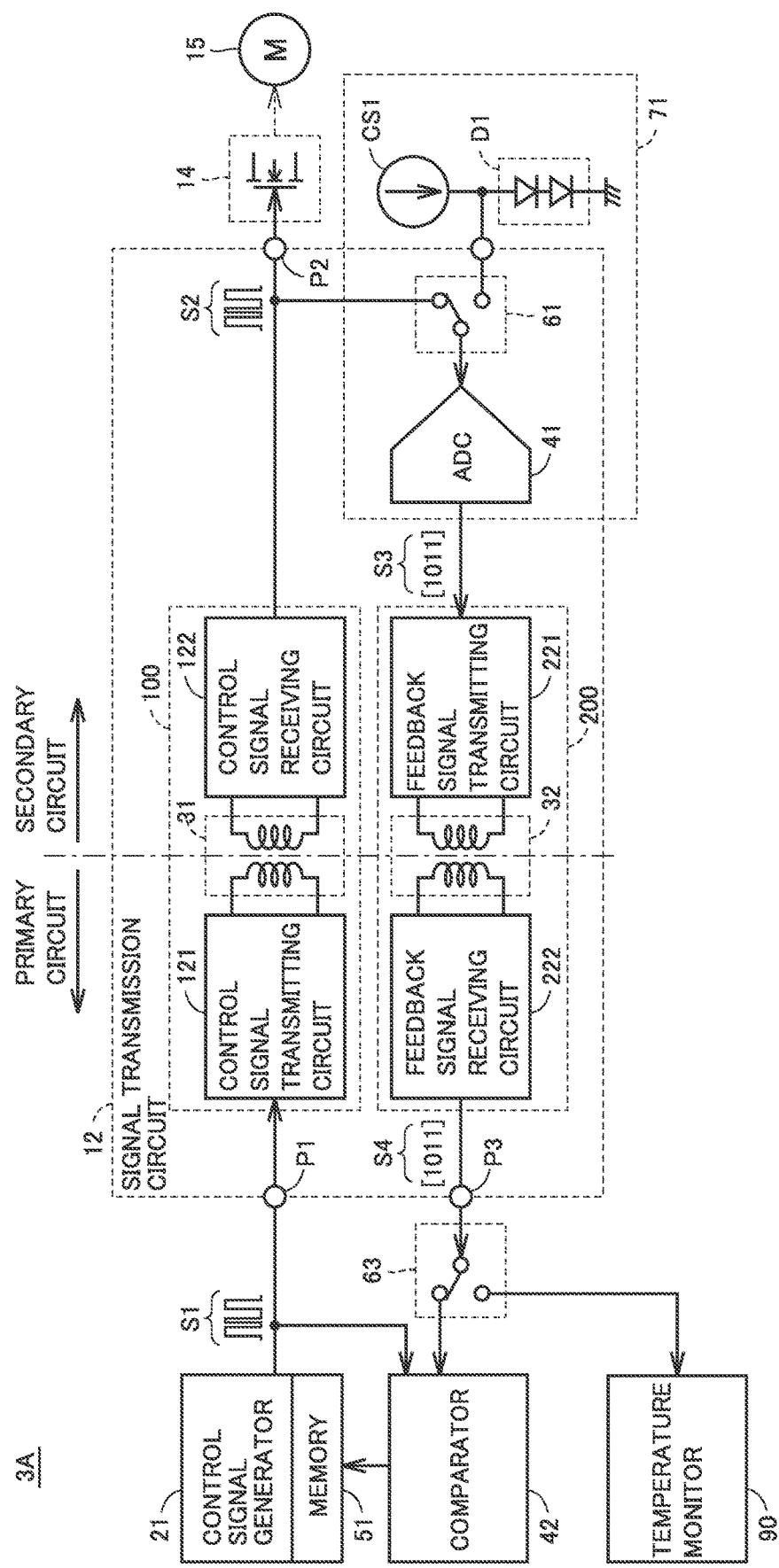
FIG. 15 is an example functional block diagram of an isolator circuit according to a variation of Embodiment 3 in the test mode.
Figure 16:
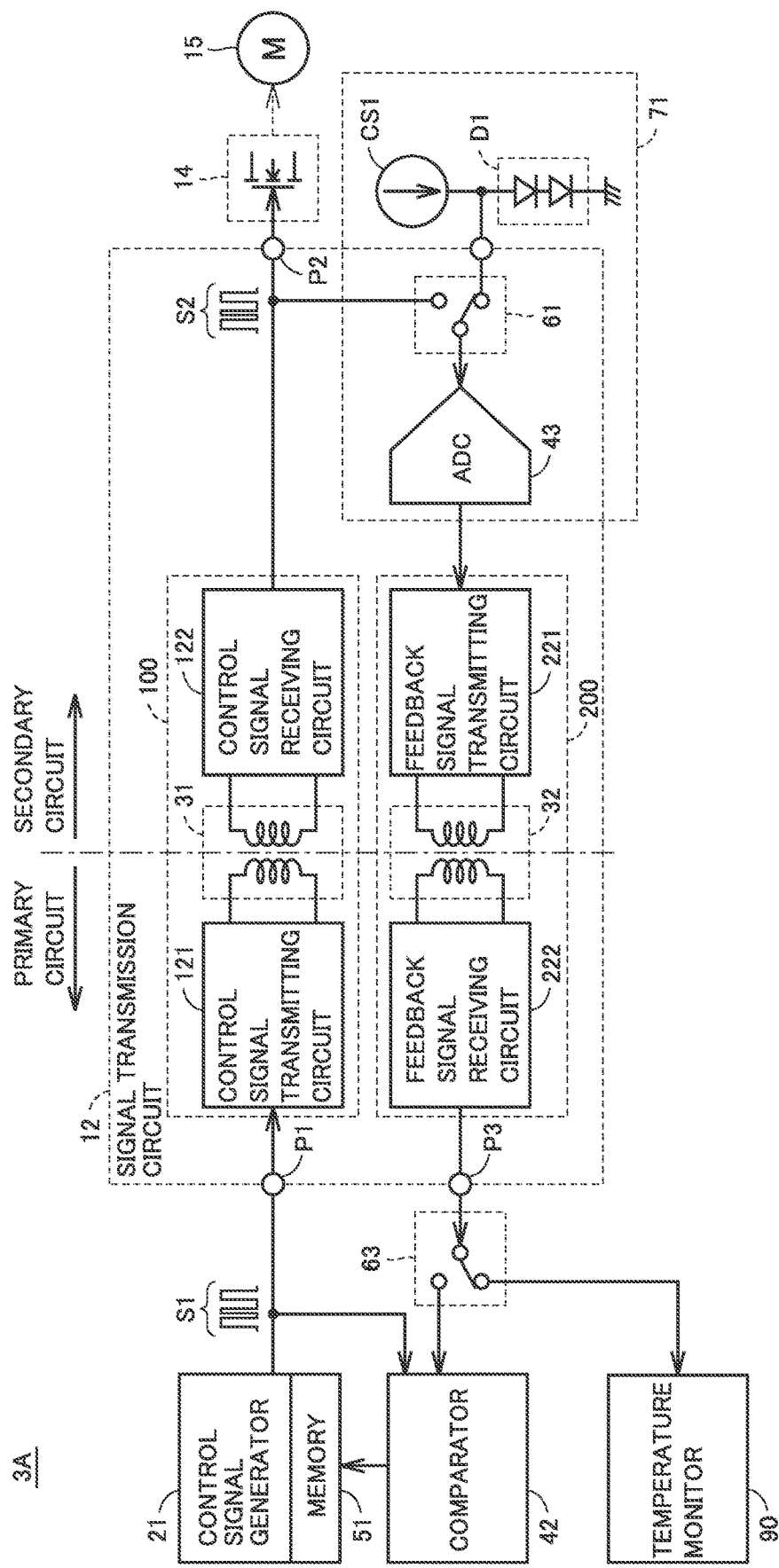
FIG. 16 is an example functional block diagram of the isolator circuit according to the variation of Embodiment 3 in the normal mode.

FIGS. 15 and 16 are example functional block diagrams each showing an isolator circuit 3A according to the variation of Embodiment 3. The configuration of isolator circuit 3A shown in FIGS. 15 and 16 includes the configuration of isolator circuit 3 shown in FIG. 13, without switch 62, and includes a switch 63. The other configurations of isolator circuit 3A are the same as those of isolator circuit 3, and thus the description thereof will not be repeated.

As shown in FIGS. 15 and 16, the output terminal of ADC 41 is connected to isolator 200. Switch 63 switches connection between a terminal P3 and comparator 42, and switches connection between terminal P3 and a temperature monitor 90. Temperature monitor 90 indicates the temperature of isolator circuit 3A based on an input signal. The operation mode of isolator circuit 3A in FIG. 15 is the test mode. The operation mode of isolator circuit 3A in FIG. 16 is the normal mode.

In FIG. 15, switch 63 connects terminal P3 and comparator 42. In FIG. 15, ADC 41 is disconnected from temperature detection circuit 71 and functions as a component of isolator circuit 3A. In FIG. 15, the duty ratio of output pulse signal S2 is converted into digital signal S3 by ADC 41. Digital signal S3 is transmitted as feedback pulse signal S4 to comparator 42. Control signal generator 21 receives a comparison result from comparator 42 and saves correction data into memory 51.

In FIG. 16, switch 63 connects terminal P3 and temperature monitor 90. In FIG. 16, ADC 41 is disconnected from isolator circuit 3A and functions as a component of temperature detection circuit 71. ADC 41 converts a forward falling voltage of diode D1 into a digital signal, and outputs the digital signal to isolator 200. The digital signal output from ADC 41 is transmitted to temperature monitor 90 via isolator 200. A temperature detected by temperature detection circuit 71 is indicated on temperature monitor 90. In FIG. 16, control signal generator 21 uses the correction data saved in memory 51 to correct and output input pulse signal S1.

As described above, the isolator circuit according to the variation of Embodiment 3 can yield the same advantageous effects as those of Embodiment 2 and the variation of Embodiment 2. The isolator circuit according to the variation of Embodiment 3 can also inhibit the expansion of the area of the isolator circuit.

The presently disclosed embodiments are also expected to be combined and implemented as appropriate within a consistent range. The presently disclosed embodiments should be considered in all aspects as illustrative and not restrictive. The scope of the present invention is defined by the appended claims, rather than by the description above. All changes which come within the meaning and range of equivalency of the appended claims are to be embraced within their scope.

REFERENCE SIGNS LIST 1, 1A, 2, 3, 3A, 10 isolator circuit; 11, 21 control signal generator; 12 signal transmission circuit; 14 power semiconductor; 15 motor; 31, 32 transformer; 31A, 32A photocoupler; 33, 42 comparator; 41 converter; 51 memory; 61, 62, 63 switch; 70, 71 temperature detection circuit; 80 over-temperature detection circuit; 90 temperature monitor; 100, 100A, 200, 200A isolator; 121 control signal transmitting circuit; 122 control signal receiving circuit; 221 feedback signal transmitting circuit; 222 feedback signal receiving circuit; CS1 constant current source; D1 diode; Df1 difference; and P1, P2, P3 terminal.

The invention claimed is:

1. An isolator circuit in which a first terminal receives a first input pulse signal, the first input pulse signal is transmitted as an output pulse signal to a second terminal, and the output pulse signal is transmitted as a feedback pulse signal to a third terminal, the isolator circuit comprising:
 a first isolator configured to galvanically isolate the first terminal from the second terminal, receive the first input pulse signal, and output the output pulse signal to the second terminal;
 an AD converter configured to output a digital signal corresponding to a duty ratio of the output pulse signal; and
 a second isolator configured to galvanically isolate the second terminal from the third terminal, receive the digital signal, and output the feedback pulse signal to the third terminal.

2. The isolator circuit according to claim 1, further comprising:
 a control signal generator configured to output a second input pulse signal to the first terminal after outputting the first input pulse signal; and
 a comparator configured to compare the first input pulse signal and the feedback pulse signal and output a comparison result to the control signal generator, wherein
 the control signal generator is configured to use the comparison result to determine a second duty ratio of the second input pulse signal.

3. The isolator circuit according to claim 2, wherein
 the comparison result includes a difference between a first duty ratio of the first input pulse signal and the feedback pulse signal, and
 the control signal generator is configured to set the second duty ratio to a value obtained by adding the difference to the first duty ratio.

4. The isolator circuit according to claim 3, wherein
 the control signal generator includes a memory, and is configured to associate and save the first duty ratio and the comparison result into the memory.

5. The isolator circuit according to claim 4, wherein the isolator circuit has a first operation mode and a second operation mode, and the control signal generator is configured to:
 in the first operation mode, output the first input pulse signal, and associate and save the first duty ratio and the comparison result into the memory; and
 in the second operation mode, use the comparison result to determine the second duty ratio and output the second input pulse signal.

6. The isolator circuit according to claim 5, wherein
 the control signal generator is configured to output a plurality of first input pulse signals having different duty ratios in the first operation mode, the plurality of first input pulse signals including the first input pulse signal.

7. The isolator circuit according to claim 2, wherein
 the AD converter includes an input terminal for receiving the output pulse signal from the first isolator, and an output terminal for outputting the digital signal, and
 the isolator circuit further includes
 a first circuit; and
 a first switch configured to
 connect the input terminal and the first isolator when the first input pulse signal is output, and
 connect the input terminal and the first circuit when the second input pulse signal is output.

8. The isolator circuit according to claim 7, further comprising:
 a second circuit; and
 a second switch configured to
 connect the output terminal and the second isolator when the first input pulse signal is output, and
 connect the output terminal and the second circuit when the second input pulse signal is output.

9. The isolator circuit according to claim 7, further comprising:
 a second circuit; and
 a second switch configured to
 connect the third terminal and the comparator when the first input pulse signal is output, and
 connect the third terminal and the second circuit when the second input pulse signal is output.

10. The isolator circuit according to claim 1, wherein the first isolator and the second isolator each include a transformer.

11. The isolator circuit according to claim 1, wherein the first isolator and the second isolator each include a photocoupler.

* * * * *